(12) United States Patent
Cheng et al.

(10) Patent No.: US 11,791,227 B2
(45) Date of Patent: Oct. 17, 2023

(54) ELECTRONIC DEVICE PACKAGE

(71) Applicant: Advanced Semiconductor Engineering, Inc., Kaohsiung (TW)

(72) Inventors: Kuoching Cheng, Kaohsiung (TW); Yuan-Feng Chiang, Kaohsiung (TW); Ya Fang Chan, Kaohsiung (TW); Wen-Long Lu, Kaohsiung (TW); Shih-Yu Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 99 days.

(21) Appl. No.: 17/317,770

(22) Filed: May 11, 2021

(65) Prior Publication Data

US 2022/0367304 A1 Nov. 17, 2022

(51) Int. Cl.
| | |
|---|---|
| *H01L 23/31* | (2006.01) |
| *H01L 25/065* | (2023.01) |
| *H01L 21/56* | (2006.01) |
| *H01L 23/538* | (2006.01) |
| *H01L 23/16* | (2006.01) |

(52) U.S. Cl.
CPC .............. *H01L 23/31* (2013.01); *H01L 21/56* (2013.01); *H01L 23/16* (2013.01); *H01L 23/5386* (2013.01); *H01L 25/0655* (2013.01)

(58) Field of Classification Search
CPC ......... H01L 23/31; H01L 21/56; H01L 23/16; H01L 23/5386; H01L 25/0655
USPC .......................................................... 257/773
See application file for complete search history.

(56) References Cited

U.S. PATENT DOCUMENTS

2019/0148341 A1* 5/2019 Liu ..................... H01L 23/5226
257/678

* cited by examiner

*Primary Examiner* — Quoc D Hoang
(74) *Attorney, Agent, or Firm* — FOLEY & LARDNER LLP

(57) ABSTRACT

An electronic device package and a method for manufacturing an electronic device package are provided. The electronic device package includes electronic device structure which includes a first electronic device and a first encapsulant, a second electronic device, and a second encapsulant. The first encapsulant encapsulates the first electronic device. The second electronic device is adjacent to the electronic device structure. The second encapsulant encapsulates the electronic device structure and the second electronic device. A first extension line along a lateral surface of the first electronic device and a second extension line along a lateral surface of the first encapsulant define a first angle, the second extension line along the lateral surface of the first encapsulant and a third extension line along a lateral surface of the second electronic device define a second angle, and the first angle is different from the second angle.

18 Claims, 18 Drawing Sheets

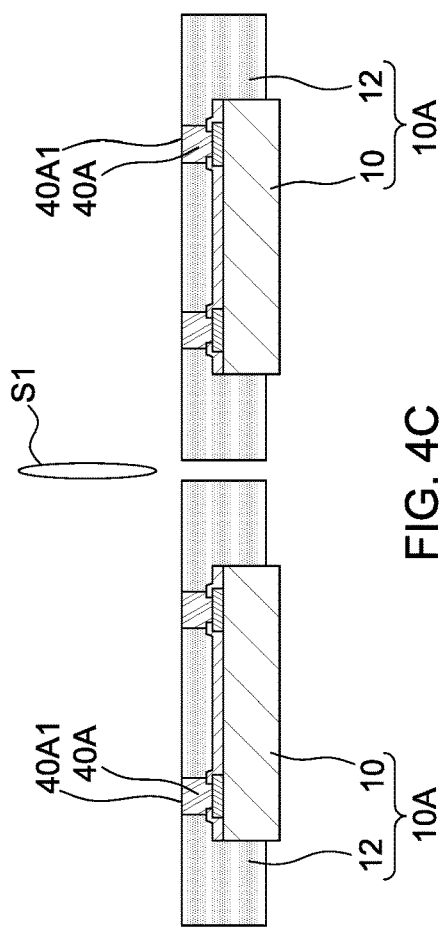
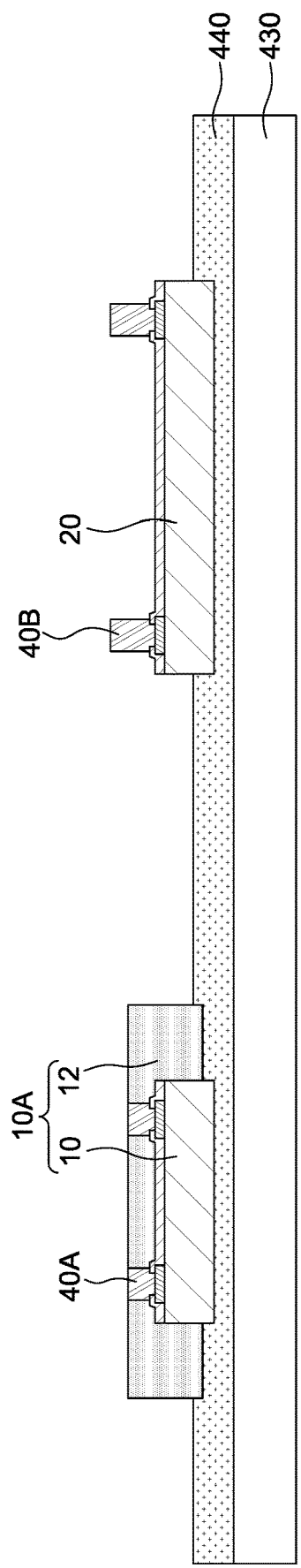
FIG. 4C
FIG. 4D

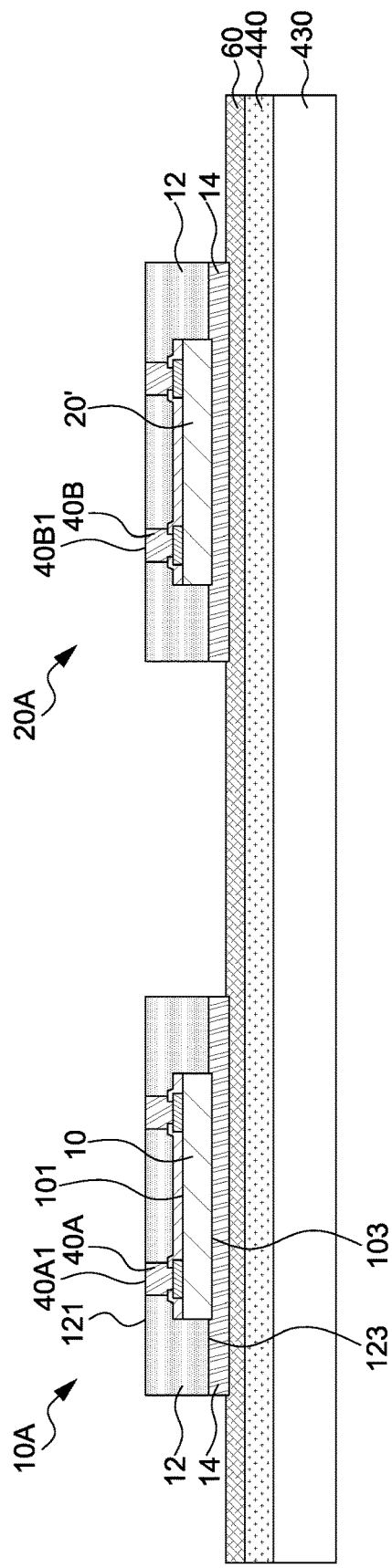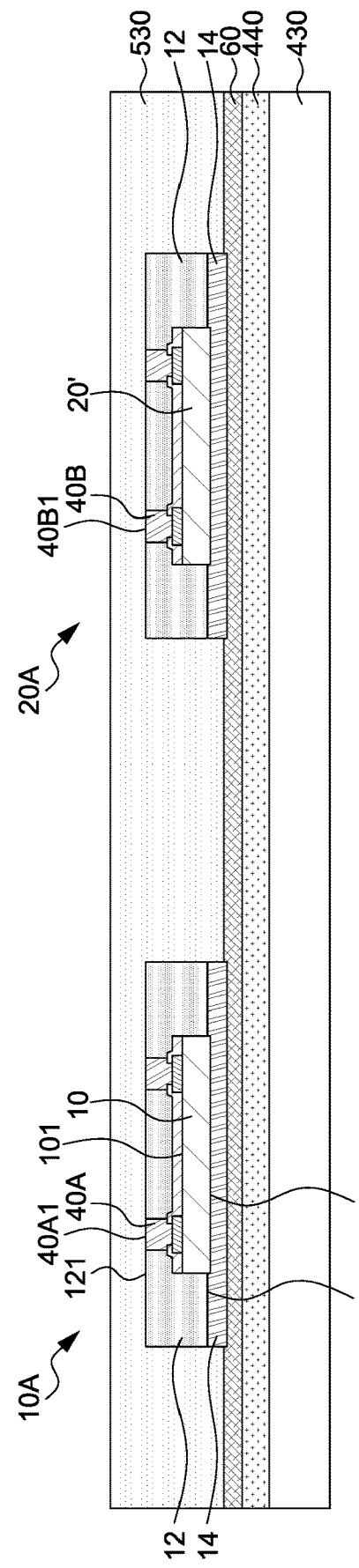

ELECTRONIC DEVICE PACKAGE

BACKGROUND

1. Technical Field

The present disclosure relates generally to an electronic device package and a method for manufacturing an electronic device package.

2. Description of the Related Art

In a chip first package, the chip (also referred to as a semiconductor die or die) is likely to be pushed by a mold flow in the process of forming an encapsulation layer, and as a result, the chip may be shifted from its predetermined location. The shift makes it difficult to electrically connect the chip to an overlying electronic component which includes electrical terminals at their predetermined locations. Accordingly, the yield of a conventional chip first package is deteriorated.

SUMMARY

In one or more embodiments, an electronic device package includes electronic device structure which includes a first electronic device and a first encapsulant, a second electronic device, and a second encapsulant. The first encapsulant encapsulates the first electronic device. The second electronic device is adjacent to the electronic device structure. The second encapsulant encapsulates the electronic device structure and the second electronic device. A first extension line along a lateral surface of the first electronic device and a second extension line along a lateral surface of the first encapsulant define a first angle, the second extension line along the lateral surface of the first encapsulant and a third extension line along a lateral surface of the second electronic device define a second angle, and the first angle is different from the second angle.

In one or more embodiments, an electronic device package includes a first electronic device, a second electronic device, a first encapsulant, a second encapsulant, and a plurality of conductive elements. The first electronic device has an active surface and a lateral surface connected to the active surface. The second electronic device is adjacent to the first electronic device, and a size of the second electronic device is greater than a size of the first electronic device. The first encapsulant encapsulates the first electronic device. The second encapsulant encapsulates the first electronic device, the first encapsulant, and the second electronic device. The conductive elements electrically connect to the first electronic device and the second electronic device. Upper surfaces of the conductive elements are substantially coplanar with an upper surface of the second encapsulant.

In one or more embodiments, a method of manufacturing an electronic device package includes the following operations: providing a first carrier; disposing a first electronic device on the first carrier by applying a first force; incorporating the first electronic device into an electronic device structure having a size greater than a size of the first electronic device; disposing the electronic device structure on a second carrier by applying a second force greater than the first force; and encapsulating the electronic device structure by a first encapsulant.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 4A, FIG. 4B, FIG. 4C, FIG. 4D, FIG. 4E, FIG. 4F, FIG. 4G, and FIG. 4H illustrate various operations in a method of manufacturing an electronic device package in accordance with some embodiments of the present disclosure; and FIG. 5A, FIG. 5B, FIG. 5C, FIG. 5D, FIG. 5E, FIG. 5F, FIG. 5G, FIG. 5H, FIG. 5I, FIG. 5J, and FIG. 5K illustrate various operations in a method of manufacturing an electronic device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
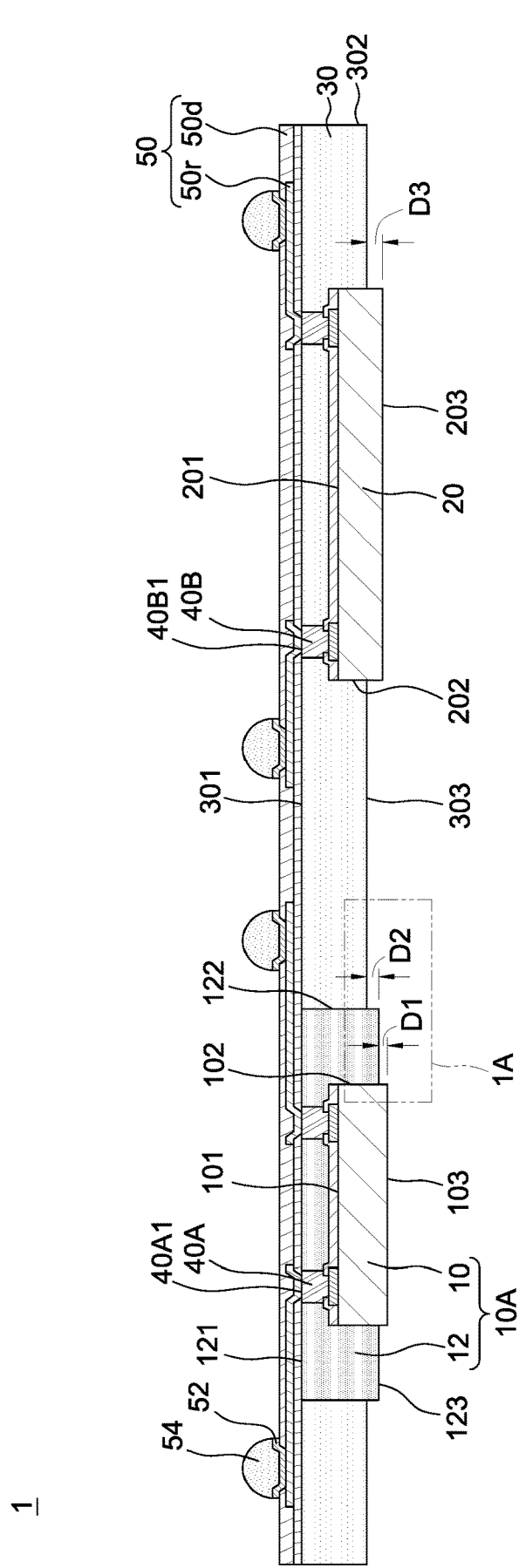
FIG. 1 illustrates a cross-sectional view of an electronic device package in accordance with some embodiments of the present disclosure.

FIG. 1 illustrates a cross-sectional view of an electronic device package 1 in accordance with some embodiments of the present disclosure. The electronic device package 1 includes an electronic device structure 10A, an electronic device 20, an encapsulant 30, conductive elements 40A and 40B, a circuit layer 50, one or more conductive pads 52, and one or more electrical contacts 54.

In some embodiments, the electronic device structure 10A includes an electronic device 10 and an encapsulant 12. The electronic device 10 may have an active surface 101, a bottom surface 103 opposite to the active surface 101, and a lateral surface 102 connected to the active surface 101. The electronic device 10 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

The encapsulant 12 may have an upper surface 121, a bottom surface 123 opposite to the upper surface 121, and a lateral surface 122 connected to the upper surface 121. In some embodiments, the encapsulant 12 is on the lateral surface 102 of the electronic device 10. In some embodiments, the encapsulant 12 is on the active surface 101 and the lateral surface 102 of the electronic device 10. In some embodiments, the encapsulant 12 covers the active surface 101 and the lateral surface 102 of the electronic device 10. In some embodiments, the encapsulant 12 encapsulates the electronic device 10. In some embodiments, the encapsulant 12 covers the active surface 101 and all of the lateral surfaces (including the lateral surface 102) of the electronic device 10 and exposes merely the bottom surface 103 of the electronic device 10. In some embodiments, the bottom surface 103 of the electronic device 10 is protruded out of the bottom surface 123 of the encapsulant 12 by a distance D1. In some embodiments, the encapsulant 12 includes an encapsulating material. The encapsulating material may include an epoxy resin having fillers, a molding compound (e.g., an epoxy molding compound or other molding compound), polyimide, a phenolic compound or material, a material with a silicone dispersed therein, or a combination thereof. In some embodiments, the encapsulant 12 may serve as an extension portion for enlarging the packaging size of the electronic device 10.

The electronic device 20 may have an active surface 201, a bottom surface 203 opposite to the active surface 201, and a lateral surface 202 connected to the active surface 201. In some embodiments, the electronic device 20 is adjacent to the electronic device structure 10A. In some embodiments, a portion of the encapsulant 12 is between the electronic device 10 and the electronic device 20. In some embodiments, the lateral surface 122 of the encapsulant 12 is between the lateral surface 102 of the electronic device 10 and the lateral surface 202 of the electronic device 20. In some embodiments, a thickness of the electronic device 10 is less than a thickness of the electronic device 20. In some embodiments, a size of the electronic device 10 is less than a size of the electronic device 20. The electronic device 20 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

The encapsulant 30 may have an upper surface 301, a bottom surface 303 opposite to the upper surface 301, and a lateral surface 302 connected to the upper surface 301. In some embodiments, the encapsulant 30 encapsulates the electronic device structure 10A and the electronic device 20. In some embodiments, the encapsulant 30 encapsulates the electronic device 10, the encapsulant 12, and the electronic device 20. In some embodiments, a portion of the encapsulant 12 is between the electronic device 10 and the encapsulant 30. In some embodiments, the electronic device 20 is between the lateral surface 302 of the encapsulant 30 and the lateral surface 122 of the encapsulant 12. In some embodiments, the upper surface 121 of the encapsulant 12 is substantially coplanar with the upper surface 301 of the encapsulant 30. The encapsulant 30 may include an epoxy resin having fillers, a molding compound (e.g., an epoxy molding compound or other molding compound), polyimide, a phenolic compound or material, a material with a silicone dispersed therein, or a combination thereof.

In some embodiments, the bottom surface 123 of the encapsulant 12 is protruded out of the bottom surface 303 of the encapsulant 30 by a distance D2. In some embodiments, the distance D2 is greater than the distance D1. In some embodiments, the bottom surface 203 of electronic device 20 is protruded out of the bottom surface 303 of the encapsulant 30 by a distance D3. In some embodiments, a sum of the distance D1 and the distance D2 is greater than the distance D3.

In some embodiments, the bottom surface 123 of the encapsulant 12 and the bottom surface 303 of the encapsulant 30 are at different elevations. In some embodiments, the encapsulant 12 and the encapsulant 30 form a stepped structure.

In some embodiments, the conductive elements 40A electrically connect to the electronic device 10, and upper surfaces 40A1 of the conductive elements 40A are substantially coplanar with the upper surface 301 of the encapsulant 30. In some embodiments, the conductive elements 40A are on the active surface 101 of the electronic device 10. In some embodiments, the conductive element 40A penetrates the encapsulant 12 to electrically connect to the electronic device 10. In some embodiments, the conductive element 40A is exposed from the encapsulant 12. In some embodiments, an upper surface 40A1 of the conductive element 40A is exposed from the encapsulant 12. In some embodiments, the upper surface 40A1 of the conductive element 40A is substantially coplanar with the upper surface 301 of the encapsulant 30.

In some embodiments, the conductive elements 40B are on the electronic device 20. In some embodiments, the conductive elements 40B electrically connect to the electronic device 20, and upper surfaces 40B1 of the conductive elements 40B are substantially coplanar with the upper surface 301 of the encapsulant 30. In some embodiments, the conductive element 40B penetrates the encapsulant 30 to electrically connect to the electronic device 20. In some embodiments, the conductive element 40B is exposed from the encapsulant 30. In some embodiments, an upper surface 40B1 of the conductive element 40B is exposed from the encapsulant 30. In some embodiments, the upper surface 40B1 of the conductive element 40B is substantially coplanar with the upper surface 301 of the encapsulant 30.

In some embodiments, the circuit layer 50 is on the encapsulant 12. In some embodiments, the circuit layer 50 is on the encapsulant 12, the encapsulant 30, and the conductive elements 40A and 40B. The circuit layer 50 includes a redistribution layer 50r (RDL) and a dielectric layer 50d. A portion of the redistribution layer 50r is covered or encapsulated by the dielectric layer 50d while another portion of the redistribution layer 50r is exposed from the dielectric layer 50d to provide electrical connections.

In some embodiments, the conductive pads 52 are on the circuit layer 50. In some embodiments, the conductive pads 52 are electrically connected to the circuit layer 50. In some embodiments, the conductive pad 52 may be or include an under-bump metallurgy layer (UBM layer).

In some embodiments, the electrical contacts 54 are on the conductive pads 52. In some embodiments, each of the electrical contacts 54 is electrically connected to the circuit layer 50 through a corresponding conductive pad 52. In some embodiments, the electrical contacts 54 include solder balls, such as controlled collapse chip connection (C4) bumps, a ball grid array (BGA), or a land grid array (LGA).

Figure 1A:
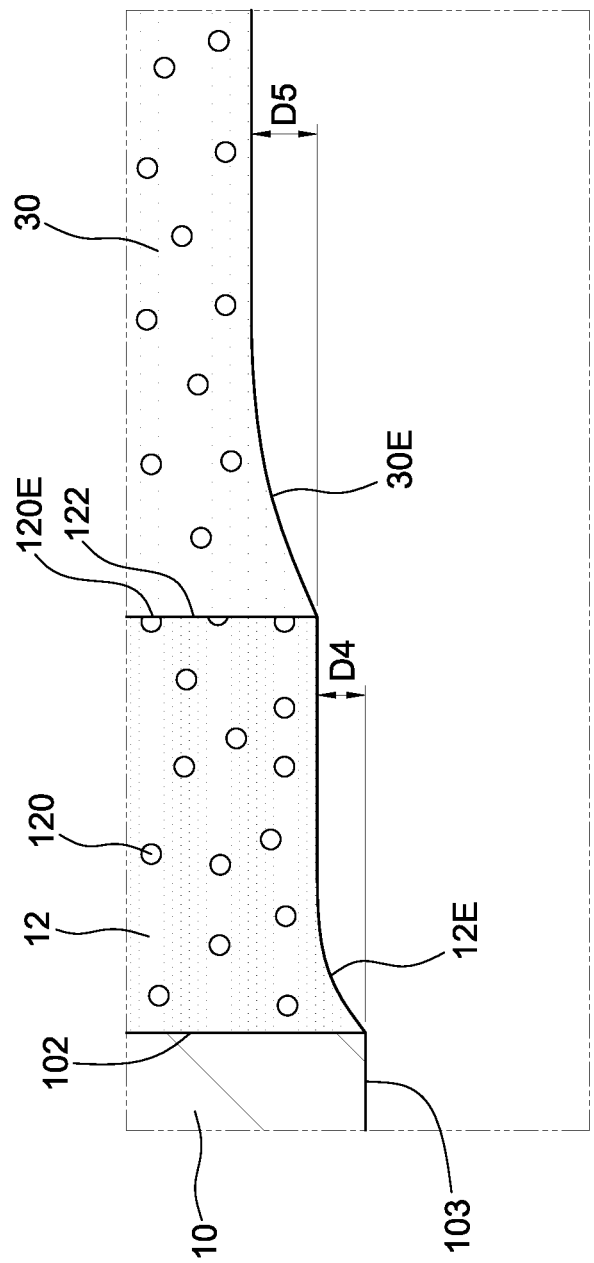
FIG. 1A illustrates a cross-sectional view of a portion of an electronic device package in accordance with some embodiments of the present disclosure.

FIG. 1A illustrates a cross-sectional view of a portion of an electronic device package 1 in accordance with some embodiments of the present disclosure. In some embodiments, FIG. 1A illustrates a cross-sectional view of the structure in a dashed box 1A in FIG. 1.

In some embodiments, the encapsulant 12 includes a curved recession 12E contacting the lateral surface 102 of the electronic device 10. In some embodiments, the curved recession 12E has a surface which is concave toward inside of the encapsulant 12. In some embodiments, the encapsulant 12 is recessed from the bottom surface 103 of the electronic device by a distance D4. In some embodiments, the curved recession 12E of the encapsulant 12 is recessed from the bottom surface 103 of the electronic device by a distance D4. In some embodiments, the distance D4 may increase from a point proximal to the electronic device 10 toward the encapsulant 30. In some embodiments, the maximum value of the distance D4 may be equal to the distance D1 by which the bottom surface 103 of the electronic device 10 is protruded out of the bottom surface 123 of the encapsulant 12.

In some embodiments, the encapsulant 30 includes a curved recession 30E contacting the lateral surface 122 of the encapsulant 12. In some embodiments, the curved recession 13E has a surface which is concave toward inside of the encapsulant 30. In some embodiments, the encapsulant 30 is recessed from the bottom surface 123 of the encapsulant 12 by a distance D5. In some embodiments, the curved recession 30E of the encapsulant 30 is recessed from the bottom surface 123 of the encapsulant 12 by a distance D5. In some embodiments, the distance D5 may increase from a point proximal to the encapsulant 12 toward away from the encapsulant 30. In some embodiments, the maximum value of the distance D5 may be equal to the distance D2 by which the bottom surface 123 of the encapsulant 12 is protruded out of the bottom surface 303 of the encapsulant 30. In some embodiments, the distance D5 is greater than the distance D4.

In some embodiments, the curved recession 12E of the encapsulant 12 has a first curvature C1, the curved recession 30E of the encapsulant 30 has a second curvature C2, and second curvature C2 is less than the first curvature C1.

In some embodiments, the encapsulant 12 further includes a plurality of fillers 120, and at least one of the fillers 120 has a cutting edge 120E. In some embodiments, the cutting edge 120E of the filler 120 is proximal to the lateral surface 122 of the encapsulant 12. In some embodiments, the cutting edge 120E of the filler 120 is substantially coplanar with the lateral surface 122 of the encapsulant 12.

Figure 1B:
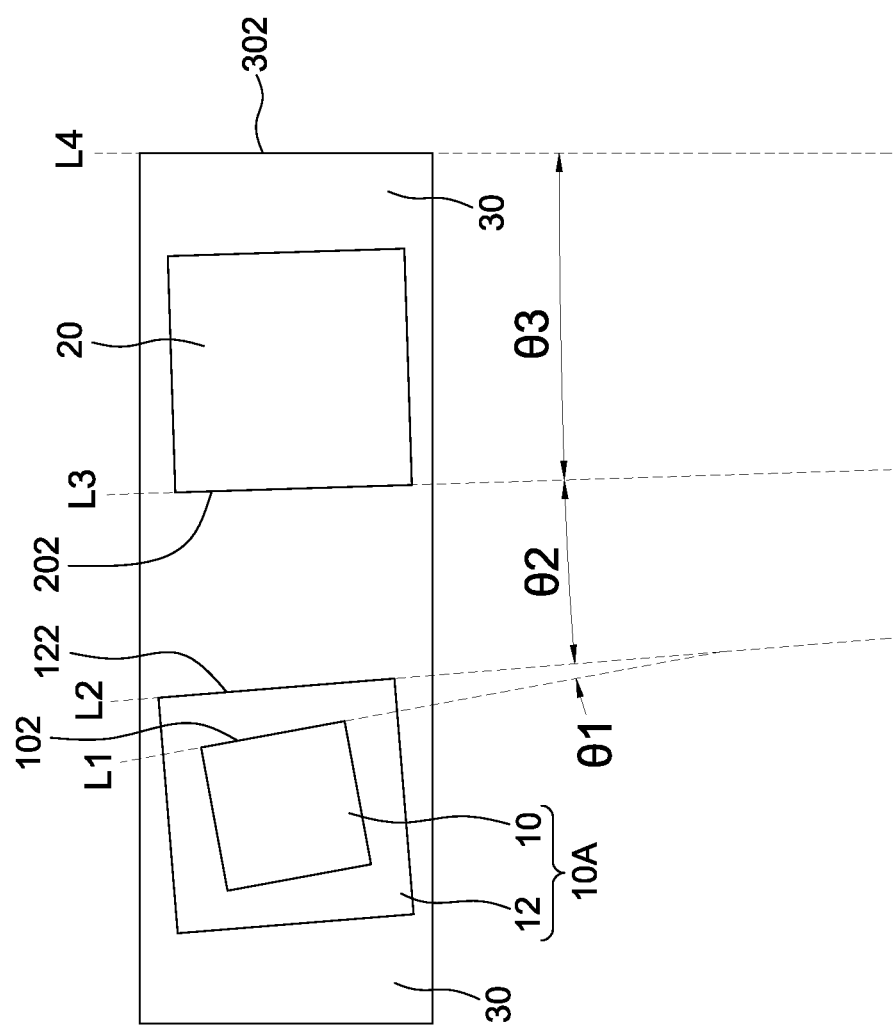
FIG. 1B illustrates a top view of an electronic device package in accordance with some embodiments of the present disclosure.

FIG. 1B illustrates a top view of an electronic device package 1 in accordance with some embodiments of the present disclosure.

In some embodiments, an extension line L1 along the lateral surface 102 of the electronic device 10 and an extension line L2 along the lateral surface 122 of the encapsulant 12 define an angle θ1, the extension line L2 along the lateral surface 122 of the encapsulant 12 and an extension line L3 along the lateral surface 202 of the electronic device 20 define an angle θ2, and the angle θ1 is different from the angle θ2. In some embodiments, the angle θ1 is greater than the angle θ2.

In some embodiments, an extension line L4 of the lateral surface 302 of the encapsulant 30 and the extension line L3 along the lateral surface 202 of the electronic device 20 define an angle θ3, and the angle θ1 is greater than the angle θ3. In some embodiments, the angle θ1 is greater than a sum of the angle θ2 and the angle θ3.

When the precision of disposing a chip or a die onto a predetermined position of a carrier may range from about 2 μm to about 5 μm, the shift in the position of a chip or a die by a mold flow in an encapsulating operation may be 30 μm or higher. As a result, the shift in the position of a chip or a die by a mold flow can significantly reduce the yield of the manufacturing process. In contrast, according to some embodiments of the present disclosure, the electronic device 10 is included in the electronic device structure 10A which has an increased size compared to that of the electronic device 10, and thus the electronic device structure 10A can sustain a force applied thereon greater than that applied on the electronic device 10. Therefore, the electronic device structure 10A can be disposed or bonded onto a carrier by applying a relatively greater force which is greater than the force that the electronic device 10 can sustain, and thus it is advantageous to increasing the adhesion between the electronic device structure 10A and the carrier. Accordingly, the shift in the position of the electronic device structure 10A by a mold flow in an encapsulating process can be reduced or prevented, and thus the yield of the electronic device package 1 can be increased.

In addition, when multiple chips or dies are molded by an encapsulant in one operation, the shifts in positions of these chips or dies by a mold flow may vary significantly, and the shifts in relative positions of the chips or dies may be too large for the redistribution layer formed thereon to compensate the shifts in wirings/contact pads of the shifted chips or dies. In contrast, according to some embodiments of the present disclosure, the electronic device 10 is packaged with the encapsulant 12 so as to form the electronic device structure 10A having an increased structural strength against the force from a mold flow. Therefore, the electronic device structure 10A and the electronic device 20 can sustain a relatively high force from a mold flow, and thus the shifts in the positions of the electronic device structure 10A and the electronic device 20 are reduced. Accordingly, it is advantageous to the formation of the redistribution layer 50r, and thus the yield of the electronic device package 1 can be increased.

Figure 2:
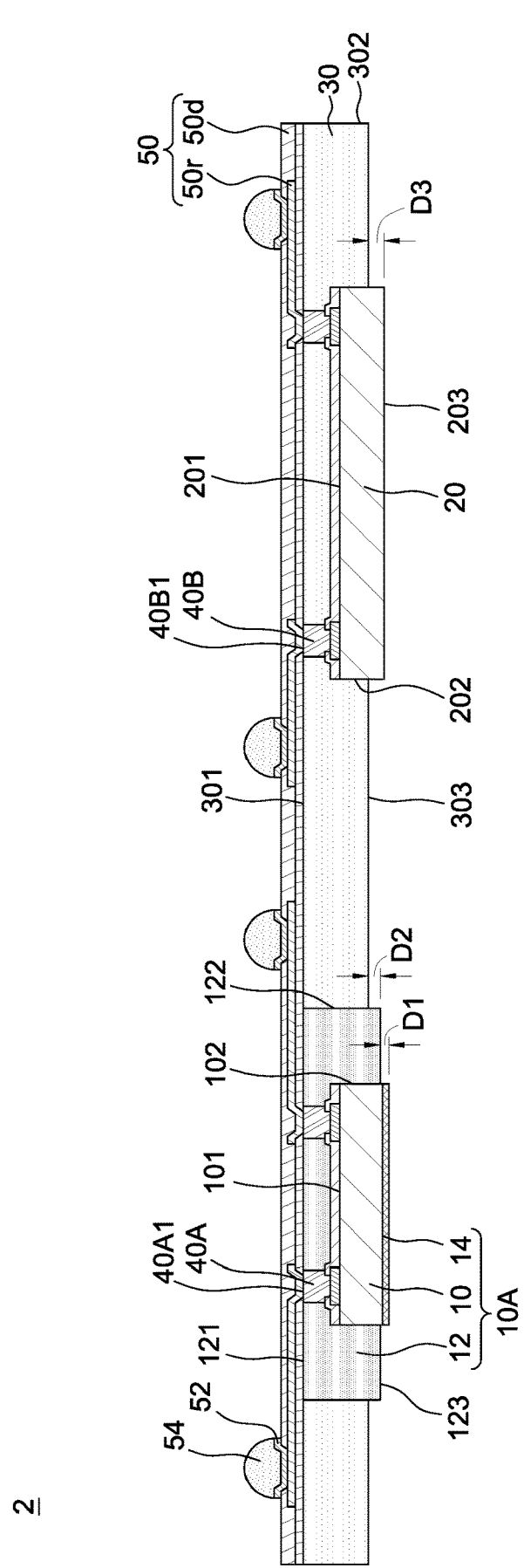
FIG. 2 illustrates a cross-sectional view of an electronic device package in accordance with some embodiments of the present disclosure.

FIG. 2 illustrates a cross-sectional view of an electronic device package 2 in accordance with some embodiments of the present disclosure. The electronic device package 2 is similar to the electronic device package 1 in FIG. 1 except that, for example, the electronic device structure 10A further includes a protection layer 14.

In some embodiments, the protection layer 14 is on the bottom surface 103 of the electronic device 10. In some embodiments, the protection layer 14 directly covers the bottom surface 103 of the electronic device 10. In some embodiments, the protection layer 14 is spaced apart from the encapsulant 12. In some other embodiments, at least a portion of the protection layer 140 directly contacts the encapsulant 12. In some embodiments, the protection layer 14 may include an adhesive layer. In some embodiments, the protection layer 14 may include a molding compound. According to some embodiments of the present disclosure, the protection layer 14 on the exposed bottom surface (or the backside surface) of the electronic device 10 can further protect the electronic device 10 from possible damages, for example, in shipping or transportation.

Figure 3:
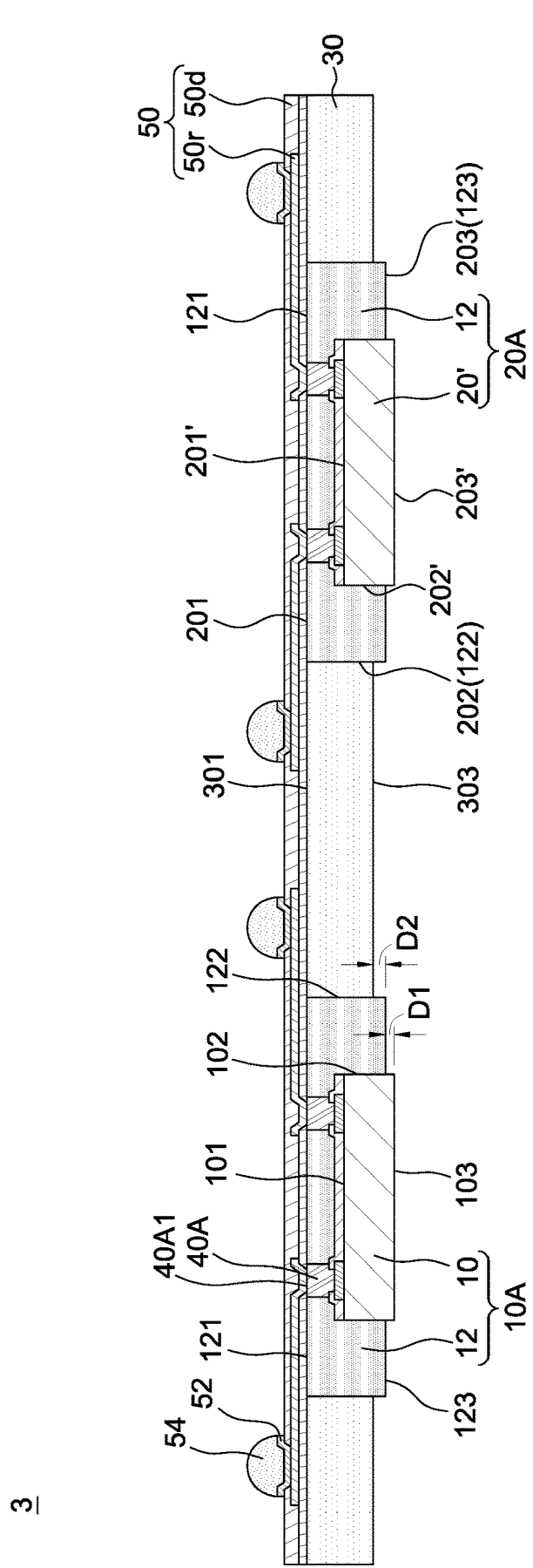
FIG. 3 illustrates a cross-sectional view of an electronic device package in accordance with some embodiments of the present disclosure.

FIG. 3 illustrates a cross-sectional view of an electronic device package 3 in accordance with some embodiments of the present disclosure. The electronic device package 3 is similar to the electronic device package 1 in FIG. 1 except that, for example, the electronic device 20A includes a different structure.

In some embodiments, the electronic device 20A may be or include a molded electronic device. In some embodiments, the electronic device 20A includes an electronic device 20' and an encapsulant 12. In some embodiments, the electronic device 20A may include a structure similar to that of the electronic device structure 10A. In some embodiments, the encapsulant 12 covers an active surface 201' and a lateral surface 202' of the electronic device 20'. A bottom surface 203' of the electronic device 20' is protruded out of the bottom surface 123 of the encapsulant 12. The electronic device 20' may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

Figure 3A:
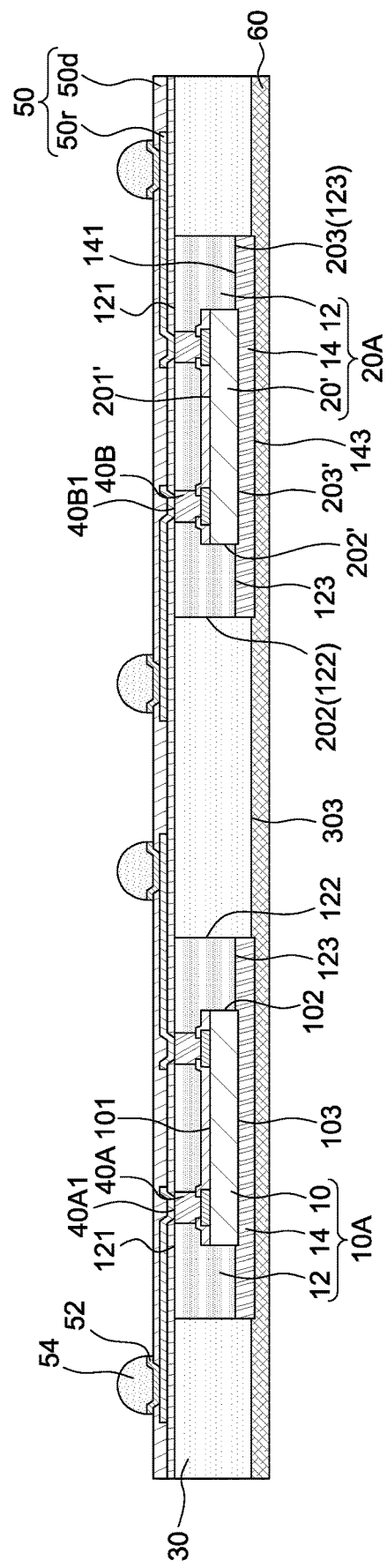
FIG. 3A illustrates a cross-sectional view of an electronic device package in accordance with some embodiments of the present disclosure.

FIG. 3A illustrates a cross-sectional view of an electronic device package 3A in accordance with some embodiments of the present disclosure. The electronic device package 3A is similar to the electronic device package 3 in FIG. 3 except that, for example, the electronic device package 3A further includes a protection layer 60.

In some embodiments, the protection layer 60 covers the bottom surface 123 of the encapsulant 12 and the bottom surface 303 of the encapsulant 30. In some embodiments, the protection layer 60 covers the protection layer 14 of the electronic device structure 10A. In some embodiments, the electronic device 20A includes a protection layer 14 on a bottom surface 203' of the electronic device 20', and the protection layer 60 covers the protection layer 14 of the electronic device 20A. In some embodiments, the protection layer 60 has a thickness ranging from about 30 µm to about 50 µm. In some embodiments, the protection layer 60 can sustain a thermal operation under a temperature up to about 170° C.

In some embodiments, a portion of the electronic device 10 is embedded in the protection layer 14. In some embodiments, the bottom surface 103 of the electronic device 10 is within the protection layer 140. In some embodiments, a portion of the electronic device 20' is embedded in the protection layer 140. In some embodiments, the bottom surface 203; of the electronic device 20' is within the protection layer 140. In some embodiments, portions of the protection layers 14 are embedded in the protection layer 60. In some embodiments, bottom surfaces 143 of the protection layers 14 are within the protection layer 60.

Figure 3B:
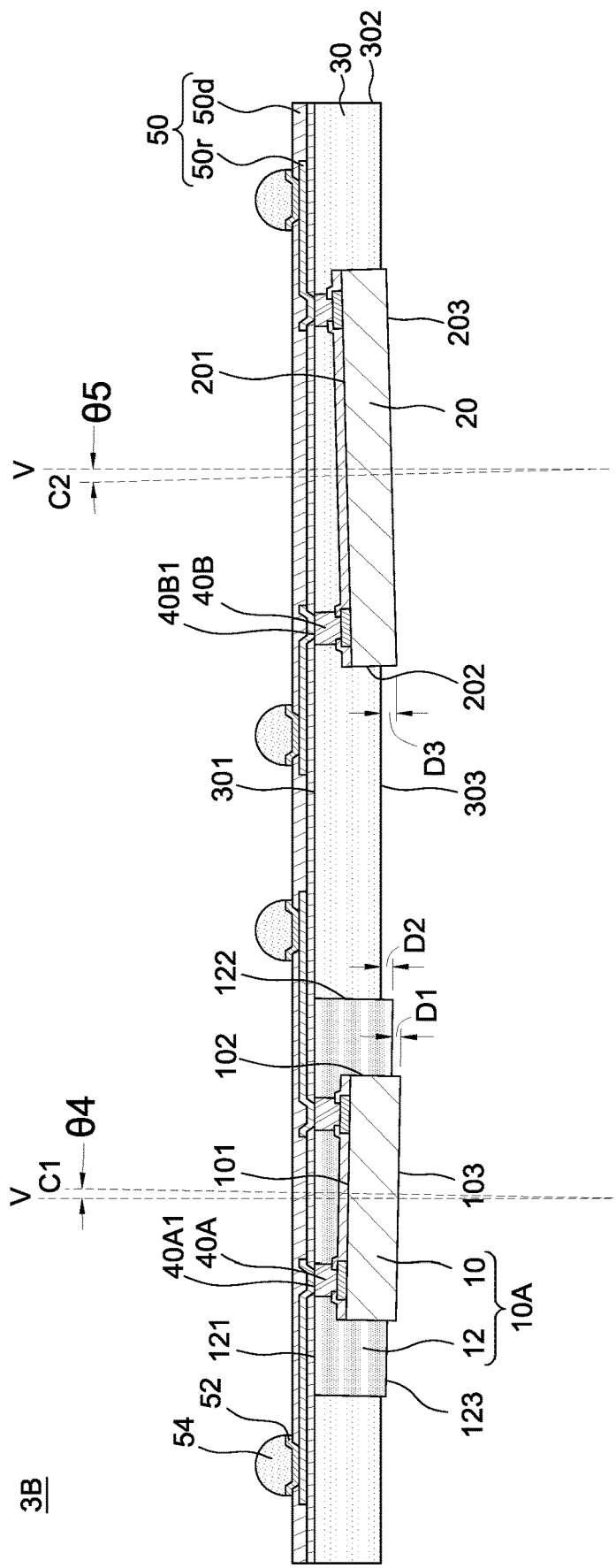
FIG. 3B illustrates a cross-sectional view of an electronic device package in accordance with some embodiments of the present disclosure.

FIG. 3B illustrates a cross-sectional view of an electronic device package 3B in accordance with some embodiments of the present disclosure. The electronic device package 3B is similar to the electronic device package 1 in FIG. 1, and the differences are described as follows.

In some embodiments, the electronic device structure 10A is tilted with respect to the upper surface 301 of the encapsulant 30. In some embodiments, a central line C1 of the electronic device structure 10A and a vertical line V perpendicular to the upper surface 301 form an angle θ4 greater than 0°. In some embodiments, the angle θ4 may be less than about 10°. In some embodiments, the angle θ4 may be less than about 5°. In some embodiments, the electronic device 20 is tilted with respect to the upper surface 301 of the encapsulant 30. In some embodiments, a central line C2 of the electronic device 20 and the vertical line V perpendicular to the upper surface 301 define an angle θ5 greater than 0°. In some embodiments, the angle θ5 may be less than about 10°. In some embodiments, the angle θ5 may be less than about 5°.

In some embodiments, the electronic device structure 10A and the electronic device 20 may tilt toward the same direction or opposite directions. In some embodiments, the angle θ4 and the angle θ5 may be substantially the same or different from each other.

FIG. 4A, FIG. 4B, FIG. 4C, FIG. 4D, FIG. 4E, FIG. 4F, FIG. 4G, and FIG. 4H illustrate various operations in a method of manufacturing an electronic device package 1 in accordance with some embodiments of the present disclosure.

An electronic device 10 may be incorporated into an electronic device structure 10A having a size greater than a size of the electronic device 10. The electronic device structure 10A may be formed by the following operations illustrated in FIGS. 4A-4C.

Figure 4A:
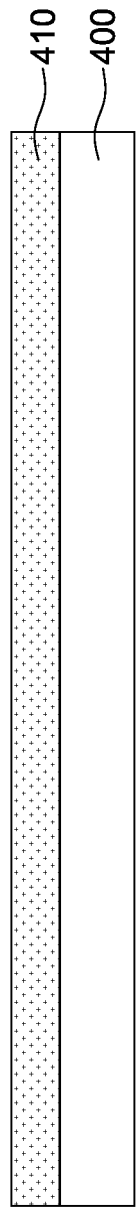

Referring to FIG. 4A, a carrier 400 is provided, and an adhesive layer 410 is formed on the carrier 400. In some embodiments, the adhesive layer 410 may be a soft layer which may be deformed (e.g., recessed or bent) upon an external force applied. In some embodiments, the adhesive layer 410 may be or include a thermal release film.

Figure 4B:
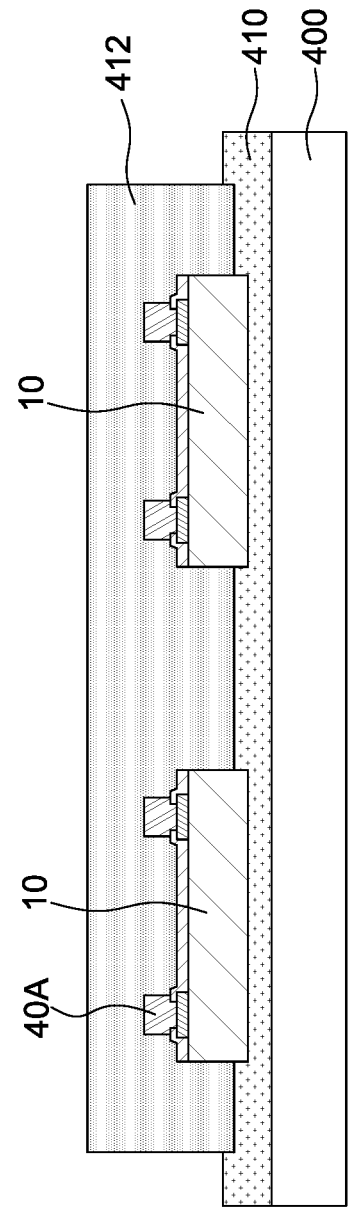

Referring to FIG. 4B, one or more electronic devices 10 are disposed on the carrier 400 by applying a first force F1. In some embodiments, the one or more electronic devices 10 are disposed on the carrier 400 by applying the first force F1. In some embodiments, the electronic devices 10 are disposed on the adhesive layer 410 by applying the first force F1. In some embodiments, the electronic devices 10 are disposed on the adhesive layer 410, and portions of the electronic devices 10 are embedded in the adhesive layer 410. In some embodiments, the one or more electronic devices 10 are covered by a material layer 412. In some embodiments, a portion of the material layer 412 is embedded in the adhesive layer 410. In some embodiments, the one or more electronic devices 10 are encapsulated by an encapsulant (e.g., the material layer 412). In some embodiments, one or more conductive elements 40A on the electronic device 10 are encapsulated by the encapsulant (e.g., the material layer 412).

Referring to FIG. 4C, a singulation operation Si may be performed on the encapsulant (e.g., the material layer 412) to form a plurality of electronic device structures 10A each incorporating one of the electronic devices 10. In some embodiments, an encapsulant 12 is formed directly on the electronic device 10. In some embodiments, the electronic device 10 is encapsulated by an encapsulant (e.g., the encapsulant 12). In some embodiments, a portion of the material layer 412 (or the encapsulant) may be removed to expose the conductive elements 40A prior to performing the singulation operation. In some embodiments, the portion of the material layer 412 may be removed by a grinding operation or a chemical mechanical polishing (CMP) operation.

Referring to FIG. 4D, the electronic device structure 10A is disposed on a carrier 430 by applying a second force F2 greater than the first force F1. In some embodiments, an electronic device 20 is disposed on the carrier 430 by applying the second force F2. In some embodiments, an adhesive layer 440 is formed on the carrier 430, and the electronic device structure 10A and the electronic device 20 are disposed on the adhesive layer 440. In some embodiments, the electronic device structure 10A is disposed on the adhesive layer 440 by applying the second force F2 greater than the first force F1. In some embodiments, the electronic device 20 is disposed on the adhesive layer 440 by applying the second force F2. In some embodiments, a portion of the electronic device structure 10A is embedded in the adhesive layer 440. In some embodiments, a portion of the electronic device 20 is embedded in the adhesive layer 440.

In some embodiments, the adhesive layer 440 may be a soft layer which may be deformed (e.g., recessed or bent) upon an external force applied. In some embodiments, the adhesive layer 440 may be or include a thermal release film. In some embodiments, the adhesive layer 440 has a thickness ranging from about 5 µm to about 10 µm. In some embodiments, the adhesive layer 440 can sustain a thermal operation under a temperature up to about 200° C.

Figure 4E:
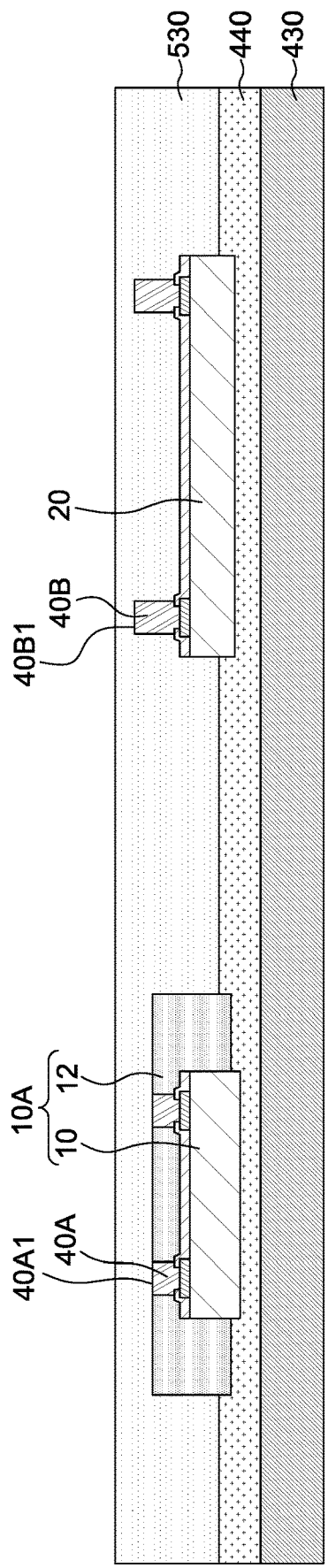

Referring to FIG. 4E, the electronic device structure 10A and the electronic device 20 are encapsulated by an encapsulant 530. In some embodiments, one or more conductive elements 40B on the electronic device 20 are encapsulated by the encapsulant 530.

Figure 4F:
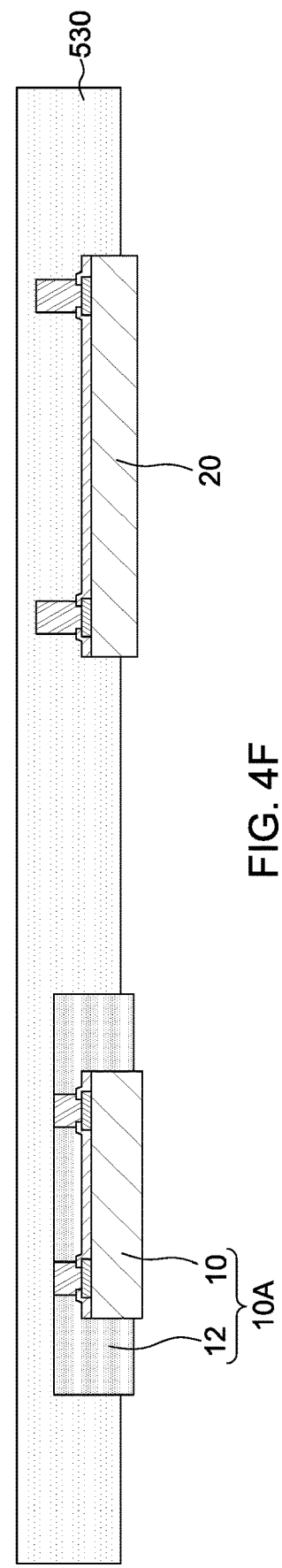

Referring to FIG. 4F, the carrier 430 and the adhesive layer 440 are removed.

Figure 4G:
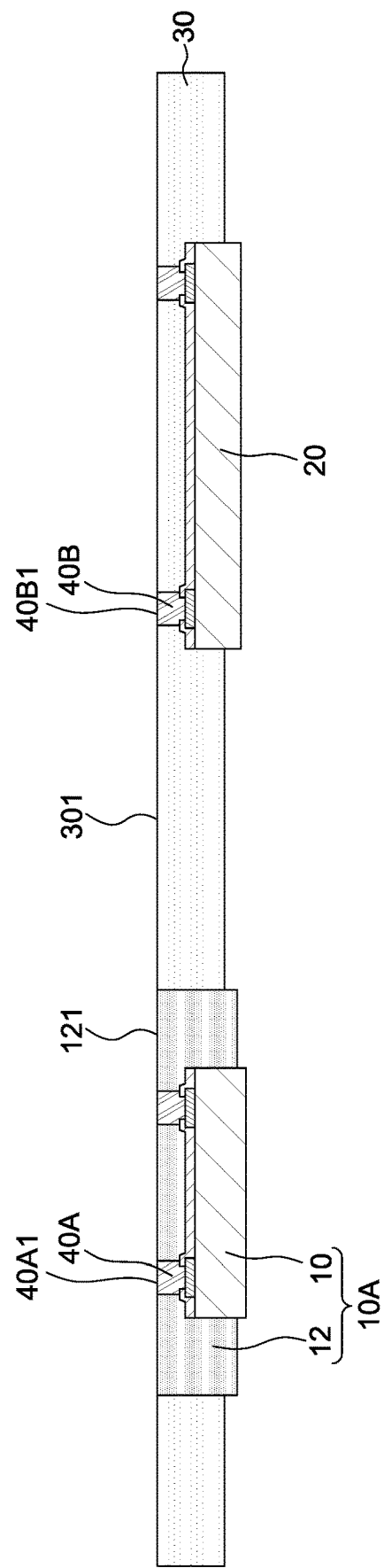

Referring to FIG. 4G, a portion of the encapsulant 530 is removed to expose the conductive element 40A on the electronic device 10 from an upper surface 301 of the encapsulant 30 and the upper surface 121 of the encapsulant 12. In some embodiments, the portion of the encapsulant 530 is removed to expose the conductive element 40B on the electronic device 20 from the upper surface 301 of the encapsulant 30. In some embodiments, the portion of the encapsulant 530 may be removed by a grinding operation or a CMP operation.

Figure 4H:
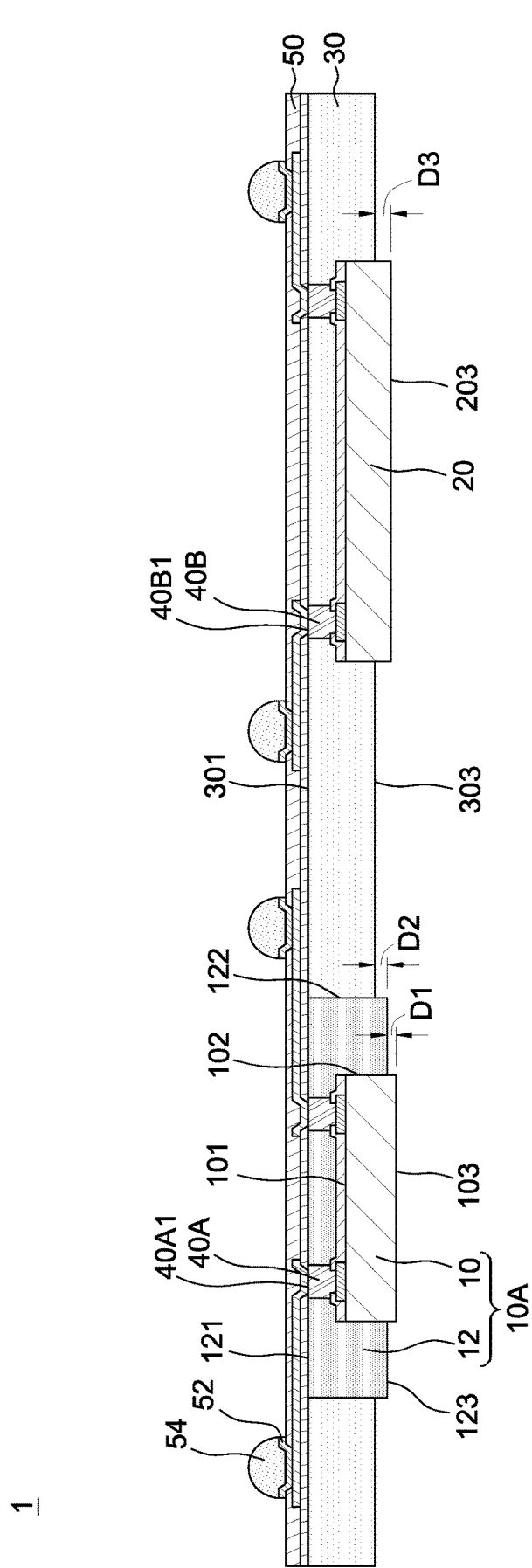

Referring to FIG. 4H, a circuit layer 50 is formed on the encapsulant 30, one or more conductive pads 52 are formed on the circuit layer 50, and one or more electrical contacts 54 are formed on the conductive pads 52. In some embodiments, the circuit layer 50 electrically connect to the conductive elements 40A and 40B. As such, the electronic device package illustrated in FIG. 1 is formed.

According to some embodiments of the present disclosure, the electronic device 10 is incorporated into the electronic device structure 10A which has an increased size compared to that of the electronic device 10, and thus the electronic device structure 10A can sustain a force applied thereon greater than that applied on the electronic device 10. Therefore, the electronic device structure 10A can be disposed on the adhesive layer 440 by applying a relatively greater force (e.g., the second force F2) which is greater than the force (e.g., the first force F1) that the electronic device 10 can sustain, and thus it is advantageous to increasing the adhesion between the electronic device structure 10A and the adhesive layer 440. Accordingly, the shift in the position of the electronic device structure 10A by a mold flow in an encapsulating process can be reduced or prevented, and thus the yield of the electronic device package 1 can be increased.

In addition, according to some embodiments of the present disclosure, the electronic device 10 is pre-molded to enlarge the size of the structure including the electronic device 10 (e.g., the electronic device structure 10A) as well as increasing the contact area between the electronic device 10A and the adhesive layer 440, and thus it is further advantageous to increasing the adhesion between the electronic device structure 10A and the adhesive layer 440. Therefore, the strength of the structure (e.g., the electronic device structure 10A) against the force applied from the mold flow can be increased, and thus the yield of the electronic device package 1 can be increased.

Moreover, according to some embodiments of the present disclosure, for electronic devices 10 and 20 having different sizes that are disposed or bonded onto a carrier 430, the relatively small electronic device 10 can be incorporated into a relatively large electronic device structure 10A which has a size that is relatively comparable to the size of the electronic device 20, and therefore the electronic device 20 and the electronic device structure 10A can be disposed or bonded onto the carrier 430 by applying substantially the same force (e.g., the force F2) or by the same operation. Therefore, the manufacturing process can be simplified and relatively more stable, which is advantageous to increasing the yield of the manufacturing process.

FIG. 5A, FIG. 5B, FIG. 5C, FIG. 5D, FIG. 5E, FIG. 5F, FIG. 5G, FIG. 5H, FIG. 5I, FIG. 5J, and FIG. 5K illustrate various operations in a method of manufacturing an electronic device package 3A in accordance with some embodiments of the present disclosure.

Figure 5A:
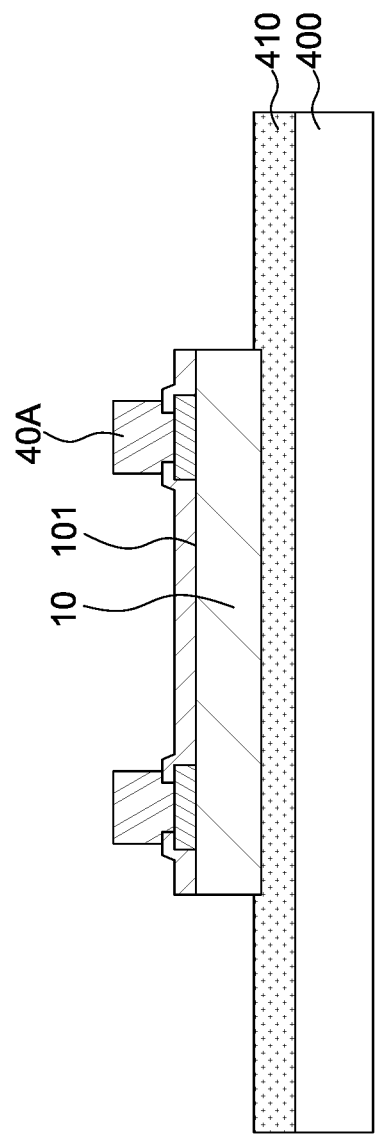

Referring to FIG. 5A, a carrier 400 is provided, an adhesive layer 410 is formed on the carrier layer 400, and an electronic device 10 is formed on the adhesive layer 410. In some embodiments, the electronic device 10 is disposed on the adhesive layer 410 by applying the first force F1. In some embodiments, a portion of the electronic device 10 is embedded in the adhesive layer 410. In some embodiments, conductive elements 40A are formed or disposed on an active surface 101 of the electronic device 10.

Figure 5B:
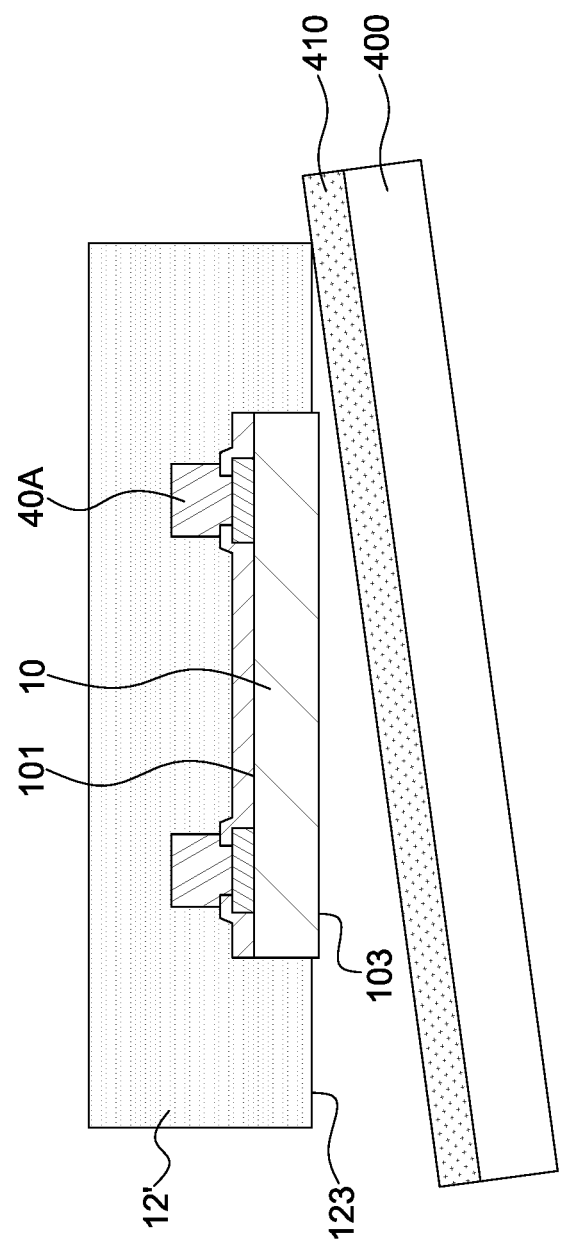

Referring to FIG. 5B, the electronic device 10 and the conductive elements 40A encapsulated by an encapsulant 12', and the carrier 400 and the adhesive layer 410 are removed exposing a bottom surface 103 of the electronic device 10. In some embodiments, the bottom surface 103 of the electronic device 10 is protruded out of a bottom surface 123 of the encapsulant 12. In some embodiments, the encapsulant 12' includes an encapsulating material.

Figure 5C:
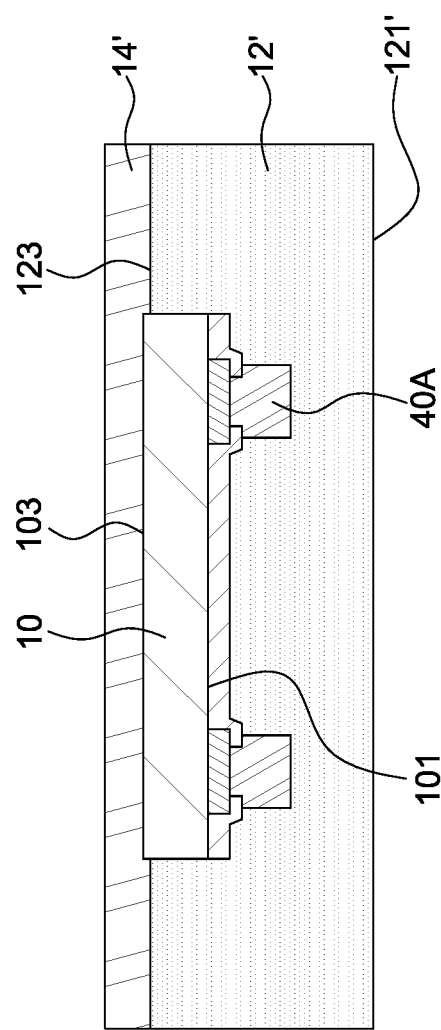

Referring to FIG. 5C, a material layer 14' is formed on the bottom surface 103 of the electronic device 10 and a bottom surface 123 of the encapsulant 12'. In some embodiments, the material layer 14' may include a B stage adhesive composition. In some embodiments, a portion of the electronic device 10 is embedded in the material layer 14'.

Figure 5D:
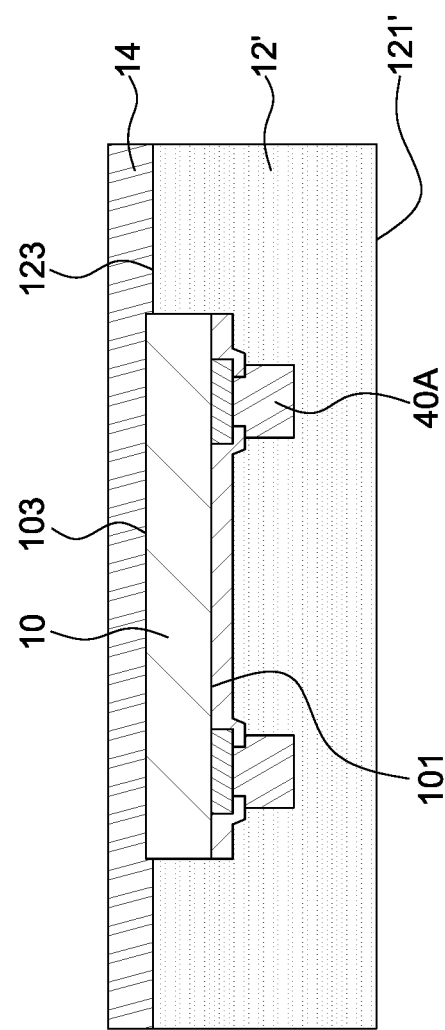

Referring to FIG. 5D, the material layer 14' is cured to form a protection layer 14 on the bottom surface 103 of the electronic device 10 and the bottom surface 123 of the encapsulant 12'. In some embodiments, a portion of the electronic device 10 is embedded in the protection layer 14.

Figure 5E:
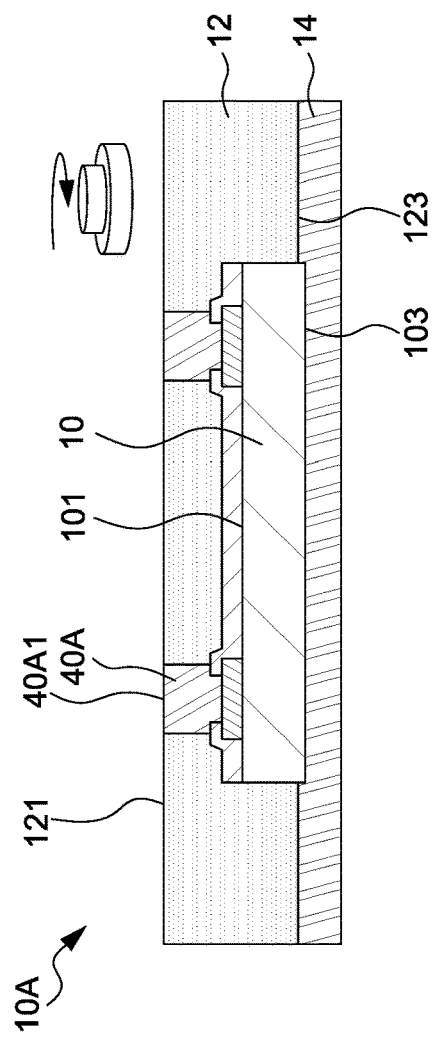

Referring to FIG. 5E, a portion of the encapsulant 12' is removed to expose upper surfaces 40A1 of the conductive elements 40A from an upper surface 121 of the encapsulant 12, so as to form an electronic device structure 10A. In some embodiments, the portion of the encapsulant 12' may be removed by a grinding operation or a CMP operation.

Figure 5F:
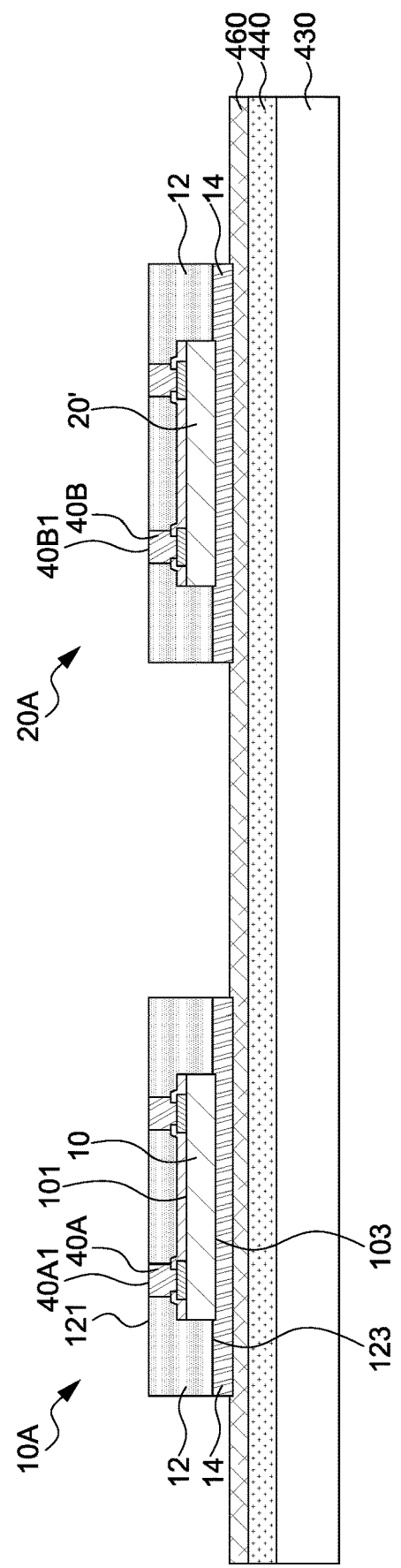

Referring to FIG. 5F, a carrier 430 is provided, adhesive layer 440 is formed on the carrier 430, a material layer 460 is formed on the adhesive layer 440, and the electronic device structure 10A is disposed on the material layer 460 by applying the second force F2 greater than the first force F1. In some embodiments, an electronic device 20A is disposed on the material layer 460 by applying the second force F2. In some embodiments, the electronic device 20A may be or include a molded electronic device 20A. In some embodiments, the electronic device 20A may include a structure similar to that of the electronic device structure 10A. In some embodiments, a portion of the electronic device structure 10A is embedded in the material layer 460. In some embodiments, a portion of the electronic device 20A is embedded in the material layer 460. In some embodiments, the material layer 460 has a thickness ranging from about 30 µm to about 50 µm. In some embodiments, the material layer 460 can sustain a thermal operation under a temperature up to about 170° C.

Referring to FIG. 5G, the material layer 460 is cured to form a protection layer 60 between the protection layers 14 and the adhesive layer 440. In some embodiments, a portion of the electronic device structure 10A is embedded in the protection layer 60. In some embodiments, a portion of the electronic device 20A is embedded in the protection layer 60.

Referring to FIG. 5H, the electronic device structure 10A and the electronic device 20A are encapsulated by an encapsulant 530.

Figure 5I:
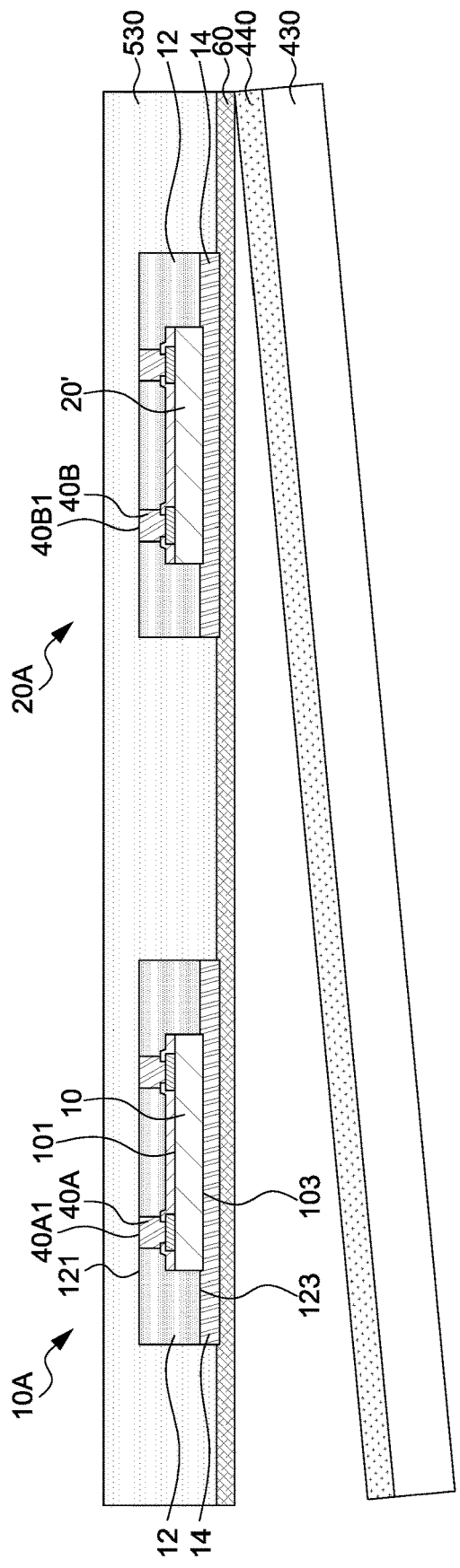

Referring to FIG. 5I, the carrier 430 and the adhesive layer 440 are removed.

Figure 5J:
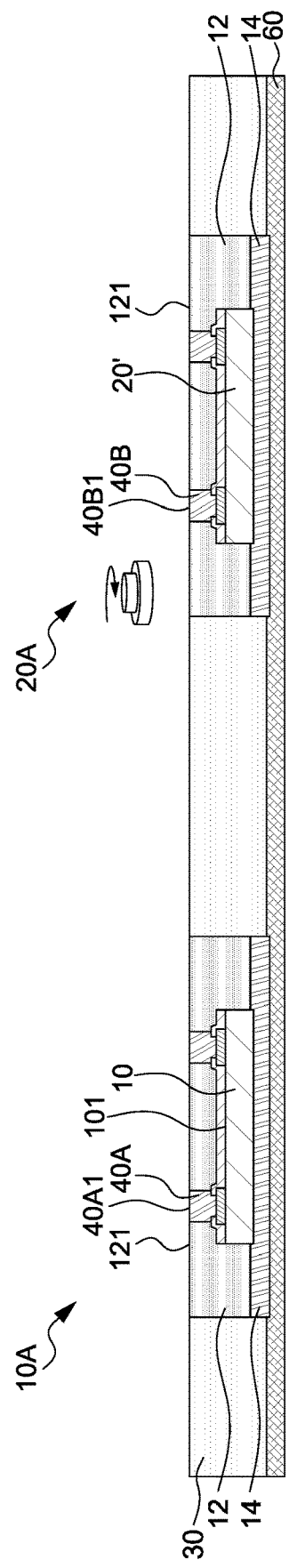

Referring to FIG. 5J, a portion of the encapsulant 530 is removed to expose the conductive elements 40A and 40B from upper surfaces 121 of the encapsulants 12. In some embodiments, the portion of the encapsulant 530 is removed to expose the conductive elements 40A and 40B from the upper surfaces 121 of the encapsulants 12. In some embodiments, the portion of the encapsulant 530 may be removed by a grinding operation or a CMP operation.

Figure 5K:
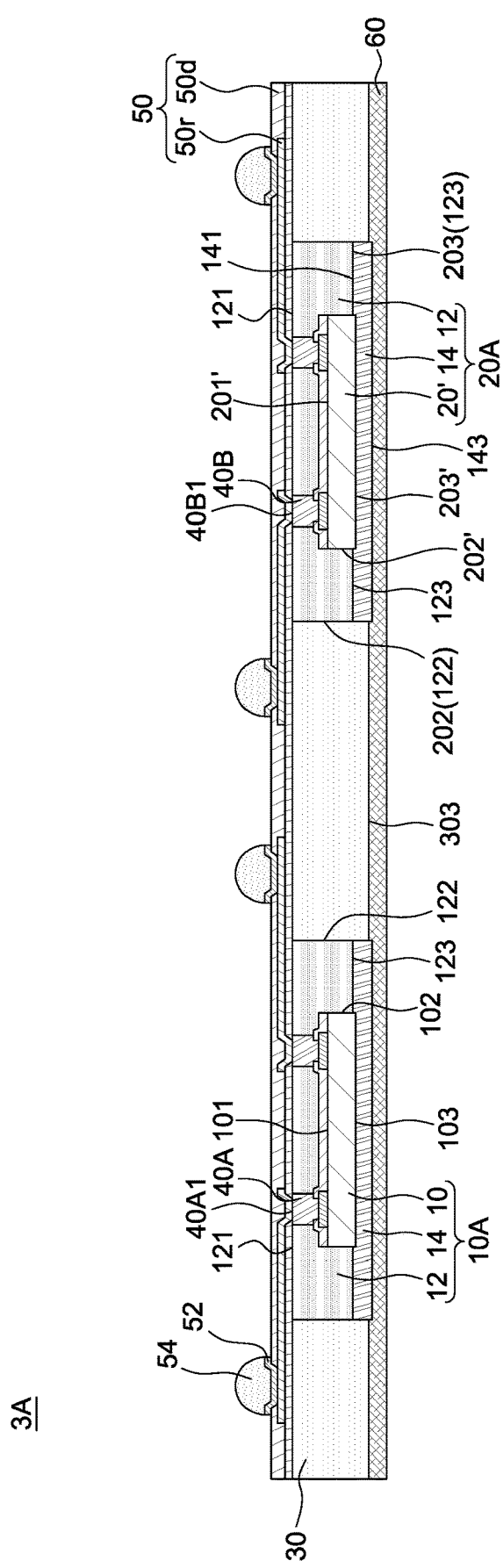

Referring to FIG. 5K, a circuit layer 50 is formed on the encapsulant 30 and conductive elements 40A and 40B, one or more conductive pads 52 are formed on the circuit layer 50, and one or more electrical contacts 54 are formed on the conductive pads 52. In some embodiments, the circuit layer 50 electrically connect to the conductive elements 40A and 40B. As such, the electronic device package 3A illustrated in FIG. 3A is formed.

According to some embodiments of the present disclosure, a material layer 460 (e.g., a B stage adhesive layer) is applied on the carrier 430, the electronic device 20 and the electronic device structure 10A are disposed on and partially within the relatively soft material layer 460, and then the material layer 460 is cured to form a protection layer 60 between the carrier 430 and the electronic device 20 and the electronic device structure 10A. Therefore, the adhesion between the carrier 430 and the electronic device 20 and the electronic device structure 10A can be significantly increased due to the curing operation. In addition, the protection layer 460 formed from curing the material layer 460 can protect the backside surfaces of the electronic device structure 10A and the electronic device 20 from damages. Therefore, the strength of the electronic device 20 and the electronic device structure 10A against the force applied from the mold flow can be further increased, and thus the yield of the electronic device package 1 can be increased.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic device package, comprising:
   an electronic device structure comprising:
   a first electronic device; and
   a first encapsulant encapsulating the first electronic device;
   a second electronic device adjacent to the electronic device structure; and
   a second encapsulant encapsulating the electronic device structure and the second electronic device;
   wherein a first extension line along a lateral surface of the first electronic device and a second extension line along a lateral surface of the first encapsulant define a first angle, the second extension line along the lateral surface of the first encapsulant and a third extension line along a lateral surface of the second electronic device define a second angle, and the first angle is different from the second angle.

2. The electronic device package as claimed in claim 1, wherein the first angle is greater than the second angle.

3. The electronic device package as claimed in claim 1, wherein a fourth extension line along a lateral surface of the second encapsulant and the third extension line along the lateral surface of the second electronic device define a third angle, and the first angle is greater than the third angle.

4. The electronic device package as claimed in claim 1, wherein the first electronic device has a bottom surface protruded out of a bottom surface of the first encapsulant by a first distance, and the bottom surface of the first encapsulant is protruded out of a bottom surface of the second encapsulant by a second distance greater than the first distance.

5. The electronic device package as claimed in claim 4, wherein the second electronic device has a bottom surface protruded out of the bottom surface of the second encapsulant by a third distance, and a sum of the first distance and the second distance is greater than the third distance.

6. The electronic device package as claimed in claim 1, wherein the first encapsulant covers an active surface of the first electronic device.

7. The electronic device package as claimed in claim 6, further comprising a first conductive element on the active surface of the first electronic device and penetrating the first encapsulant, wherein an upper surface of the first conductive element is exposed from the first encapsulant and substantially coplanar with an upper surface of the second encapsulant.

8. The electronic device package as claimed in claim 7, further comprising a second conductive element on the second electronic device and penetrating the second encapsulant, wherein an upper surface of the second conductive element is exposed from the second encapsulant and substantially coplanar with the upper surface of the second encapsulant.

9. The electronic device package as claimed in claim 7, wherein an upper surface of the first encapsulant is substantially coplanar with the upper surface of the second encapsulant.

10. The electronic device package as claimed in claim 1, wherein the first encapsulant comprises a first curved recession contacting the lateral surface of the first electronic device.

11. The electronic device package as claimed in claim 10, wherein the second encapsulant comprises a second curved recession contacting the lateral surface of the first encapsulant.

12. The electronic device package as claimed in claim 11, wherein the first curved recession of the first encapsulant has a first curvature, and the second curved recession of the second encapsulant has a second curvature less than the first curvature.

13. The electronic device package as claimed in claim 1, wherein the first encapsulant is recessed from a bottom surface of the first electronic device by a first distance, and the second encapsulant is recessed from a bottom surface of the first encapsulant by a second distance greater than the first distance.

14. The electronic device package as claimed in claim 1, wherein the first encapsulant further comprises a plurality of fillers, wherein at least one of the fillers has a cutting edge proximal to the lateral surface of the first encapsulant.

15. An electronic device package, comprising:
a first electronic device having an active surface and a lateral surface connected to the active surface;
a second electronic device adjacent to the first electronic device, a size of the second electronic device being greater than a size of the first electronic device;
a first encapsulant encapsulating the first electronic device;
a second encapsulant encapsulating the first electronic device, the first encapsulant, and the second electronic device; and
a plurality of conductive elements electrically connecting to the first electronic device and the second electronic device, wherein upper surfaces of the conductive elements are substantially coplanar with an upper surface of the second encapsulant,
wherein a first extension line along a lateral surface of the first electronic device and a second extension line along a lateral surface of the first encapsulant define a first angle, the second extension line along the lateral surface of the first encapsulant and a third extension line along a lateral surface of the second electronic device define a second angle, and the first angle is greater than the second angle.

16. The electronic device package as claimed in claim 15, wherein a fourth extension line of a lateral surface of the second encapsulant and the third extension line along the lateral surface of the second electronic device define a third angle, and the first angle is greater than the third angle.

17. An electronic device package, comprising:
a first electronic device comprising a first active surface and a first conductive element protruded from the first active surface of the first electronic device;
a second electronic device adjacent to the first electronic device, wherein the second electronic device comprises a second active surface and a second conductive element protruded from the second active surface of the second electronic device, and the second conductive element is electrically connected to the first conductive element and
an encapsulant encapsulating the first electronic device and the second electronic device,
wherein an upper surface of the second conductive element substantially aligns with an upper surface of the first conductive element, and
wherein the first electronic device comprises a first lateral surface facing the second electronic device, the second electronic device comprises a second lateral surface facing the first electronic device, and the first lateral surface is separated from the second lateral surface by a non-uniform distance.

18. The electronic device package as claimed in claim 17, wherein the first conductive element and the second conductive element are exposed from an upper surface of the encapsulant, the first active surface is non-parallel to the upper surface of the encapsulant, and the second active surface is non-parallel to the upper surface of the encapsulant.

* * * * *